(12) United States Patent
Osada et al.

(10) Patent No.: US 7,379,328 B2
(45) Date of Patent: May 27, 2008

(54) SEMICONDUCTOR DEVICE

(75) Inventors: Kenichi Osada, Tokyo (JP); Kiyoo Itoh, Higashikurume (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/812,641

(22) Filed: Jun. 20, 2007

(65) Prior Publication Data

US 2007/0263433 A1    Nov. 15, 2007

Related U.S. Application Data

(62) Division of application No. 10/933,336, filed on Sep. 3, 2004, now Pat. No. 7,251,157.

(30) Foreign Application Priority Data

Mar. 12, 2004   (JP)   ............................ 2004-069985

(51) Int. Cl.
   *G11C 11/00*   (2006.01)
   *G11C 5/06*    (2006.01)
   *G11C 7/02*    (2006.01)
   *G11C 8/00*    (2006.01)

(52) U.S. Cl. .................. 365/163; 365/63; 365/148; 365/210; 365/230.03

(58) Field of Classification Search .................. 365/63, 365/210, 230.03, 163
   See application file for complete search history.

(56) References Cited

U.S. PATENT DOCUMENTS

| | | | |
|---|---|---|---|
| 5,122,856 A | 6/1992 | Komiya | |
| 6,314,014 B1 * | 11/2001 | Lowrey et al. | 365/100 |
| 6,759,707 B2 | 7/2004 | Prall | |
| 6,862,214 B2 * | 3/2005 | Lee et al. | 365/163 |
| 6,894,392 B1 | 5/2005 | Gudeson et al. | |
| 6,961,277 B2 | 11/2005 | Moore et al. | |
| 7,106,639 B2 * | 9/2006 | Taussig et al. | 365/200 |
| 2002/0196659 A1 | 12/2002 | Hurst et al. | |
| 2003/0136978 A1 | 7/2003 | Takaura et al. | |
| 2003/0146469 A1 | 8/2003 | Matsuoka et al. | |
| 2004/0051094 A1 | 3/2004 | Ooishi | |

(Continued)

FOREIGN PATENT DOCUMENTS

| | | |
|---|---|---|
| JP | 03-121581 | 10/1989 |
| JP | 2002-026283 | 6/2000 |

(Continued)

OTHER PUBLICATIONS

Mansur Gill et al., "Ovonic Unified Memory—A High Performance Nonvolatile Memory Technology for Stand-Alone Memory and Embedded Application", 2002 IEEE International Solid-State Circuits Conference, Digest of Technical Papers, pp. 202-203.

A. Pirovano et al., "Electronic Switching Effect in Phase-Change Memory Cells", 2002 IEEE International Electron Devices Meeting, Technical digest, pp. 923-926.

*Primary Examiner*—Ly Duy Pham
(74) *Attorney, Agent, or Firm*—Reed Smith L.L.P.; Stanley P. Fisher, Esq.; Juan Carlos A. Marquez, Esq.

(57) ABSTRACT

Memory blocks having memory cells which are comprised of vertical transistors and memory elements in which the resistance value is varied depending on the temperature imposed on the upper side thereof, are laminated to realize a highly-integrated non-volatile memory.

2 Claims, 16 Drawing Sheets

U.S. PATENT DOCUMENTS

| | | |
|---|---|---|
| 2004/0052117 A1 | 3/2004 | Jiang et al. |
| 2004/0151023 A1 | 8/2004 | Khouri et al. |
| 2004/0151024 A1* | 8/2004 | Fricke et al. ............... 365/177 |
| 2004/0166604 A1 | 8/2004 | Ha et al. |
| 2004/0184331 A1 | 9/2004 | Hanzawa et al. |
| 2004/0233705 A1* | 11/2004 | Voshell et al. .............. 365/154 |
| 2004/0233748 A1 | 11/2004 | Terao et al. |
| 2004/0233769 A1* | 11/2004 | Matsuoka et al. .......... 365/232 |
| 2004/0240292 A1 | 12/2004 | Sakata et al. |
| 2004/0246808 A1* | 12/2004 | Cho et al. .............. 365/230.06 |
| 2004/0258866 A1* | 12/2004 | Shiba et al. ................ 428/35.7 |
| 2005/0018593 A1* | 1/2005 | Doi et al. ................. 369/275.2 |
| 2005/0023656 A1* | 2/2005 | Leedy ........................ 257/678 |
| 2005/0063225 A1 | 3/2005 | Takashima |
| 2005/0098811 A1* | 5/2005 | Ogiwara ..................... 257/295 |
| 2005/0111247 A1* | 5/2005 | Takaura et al. ................. 365/2 |
| 2005/0226041 A1 | 10/2005 | Nejad et al. |

FOREIGN PATENT DOCUMENTS

| | | |
|---|---|---|
| JP | 2003-100084 | 9/2001 |
| JP | 2003-229537 | 2/2002 |

* cited by examiner

SEMICONDUCTOR DEVICE

CROSS-REFERENCE TO RELATED APPLICATION

This application is a Divisional application of U.S. application Ser. No. 10/933,336 filed Sep. 3, 2004, now U.S. Pat. No. 7,251,157, which claims priority of Japanese Patent App. No. 2004-069985 filed on Mar. 12, 2004, the content of which is hereby incorporated by reference into this application.

TECHNICAL FIELD OF THE INVENTION

The present invention relates to a semiconductor device or a semiconductor memory device, particularly relates to a random access memory having high-integration and non-volatility.

BACKGROUND OF THE INVENTION

Aiming for a high-speed highly-integrated non-volatile memory, phase-change memories are under development, as described in "2002 IEEE International Solid-State Circuits Conference, Digest of Technical Papers, pp. 202-203". In the phase-change memory, data is stored by taking advantage of the characteristic that a phase-change material called chalcogenide material has different resistances depending on its condition. Rewriting of a phase-change resistor is performed by changing the conditions by applying electric current so as to generate heat. Increasing resistance (transition to amorphous state) which is called RESET operation is carried out by maintaining a comparatively high temperature, and reducing resistance (crystallization) which is called SET operation is carried out by maintaining a comparatively low temperature for enough period of time. Reading out operation of the phase-change material is carried out by applying electric current in the degree that does not change the state of the phase-change resistor.

The characteristics of phase-change resistor are described in

"2002 IEEE International Electron Devices Meeting, Technical Digest, pp. 923-926" and the Japanese Patent Application Laid-Open No. 2003-100084. In addition, a memory cell comprises a phase-change resistor and an NMOS transistor is described in "2003 Non-Volatile Semiconductor Memory Workshop, Digest of Technical Papers, pp. 91-92".

In these documents, not only a high speed ROM (Read-Only Memory) but also the possibility of non-volatile RAM (Random Access Memory) is described, and realization of an integrated type memory which has both functions of ROM and RAM is mentioned. In a phase-change memory having small electrode area of a phase-change resistor, resistance value can be changed with a little electricity, therefore scaling of a cell is easy. In addition, a high-speed reading operation can be realized since the resistance value difference in amorphous state and crystalline state is large. Because of the above described reasons, realization of a high-speed non-volatile memory employing a phase-change memory has been expected.

In the Japanese Patent Application Laid-Open No. 2003-229537, a memory cell structure employing a phase-change resistor and a vertical transistor is described. A memory cell having small area compare with conventional DRAM is realized by employing the memory cell structure.

SUMMARY OF THE INVENTION

The memory cell comprised of phase-change resistor and a vertical transistor which is described in the above descriptions, has an area of 4F2 which is about half of a common DRAM of 8F2. However, when compared with a memory device such as a hard disk device which is widely employed in personal computers, cost per bit is expensive about ten times. Herein, F refers to a minimum processing size.

An object to be attained by the present invention is to, for example, effectively realize a further-highly-integrated memory cell, or to reduce the cost per bit by effectively simplifying the production process.

A simple explanation summarizing a typical configuration of the inventions disclosed in the present application is as the following.

A highly-integrated non-volatile memory is formed by laminating memory blocks each of which comprising vertical transistors and memory cells comprised of a memory element in which resistance value varies depending on the temperature applied to its upper or lower side.

A highly-integrated non-volatile memory is realized according to the present invention.

BRIEF DESCRIPTIONS OF THE DRAWINGS

DESCRIPTION OF THE PREFERRED EMBODIMENTS

Several preferred examples of the semiconductor memory devices according to the present invention will next be explained by use of drawings. Unless otherwise stated, a low level of signal is referred to as 'L', and a high level is referred to as 'H'.

Embodiment 1

Plan View and Sectional View

Figure 1:
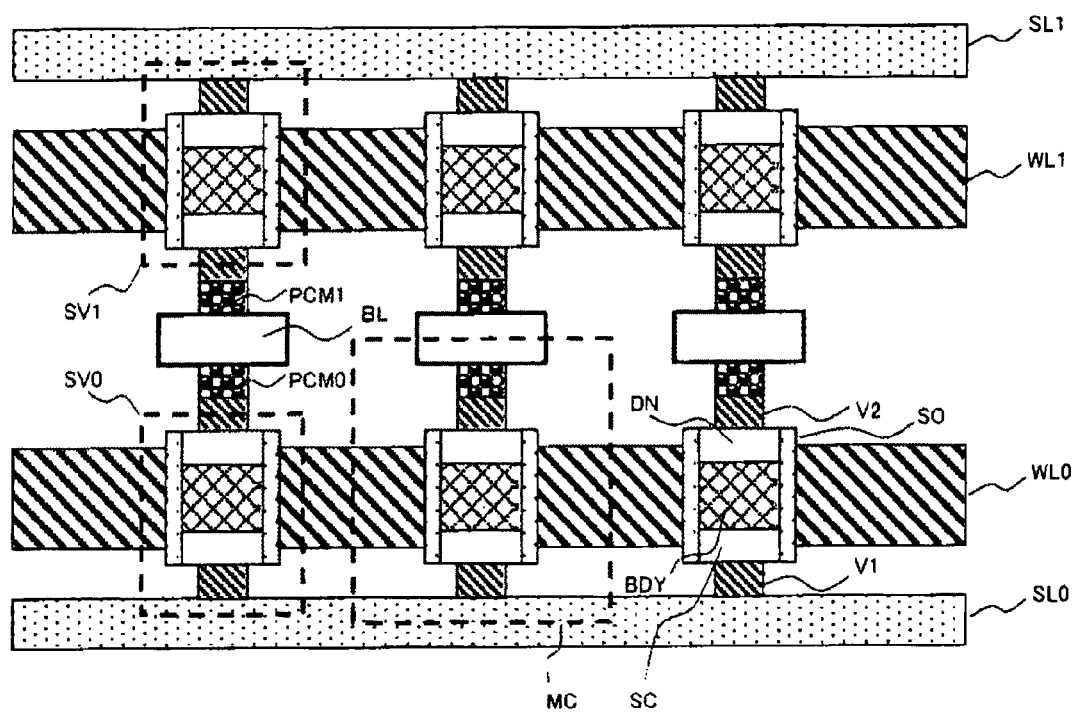
FIG. 1 is a cross section of a memory cell array.
Figure 2:
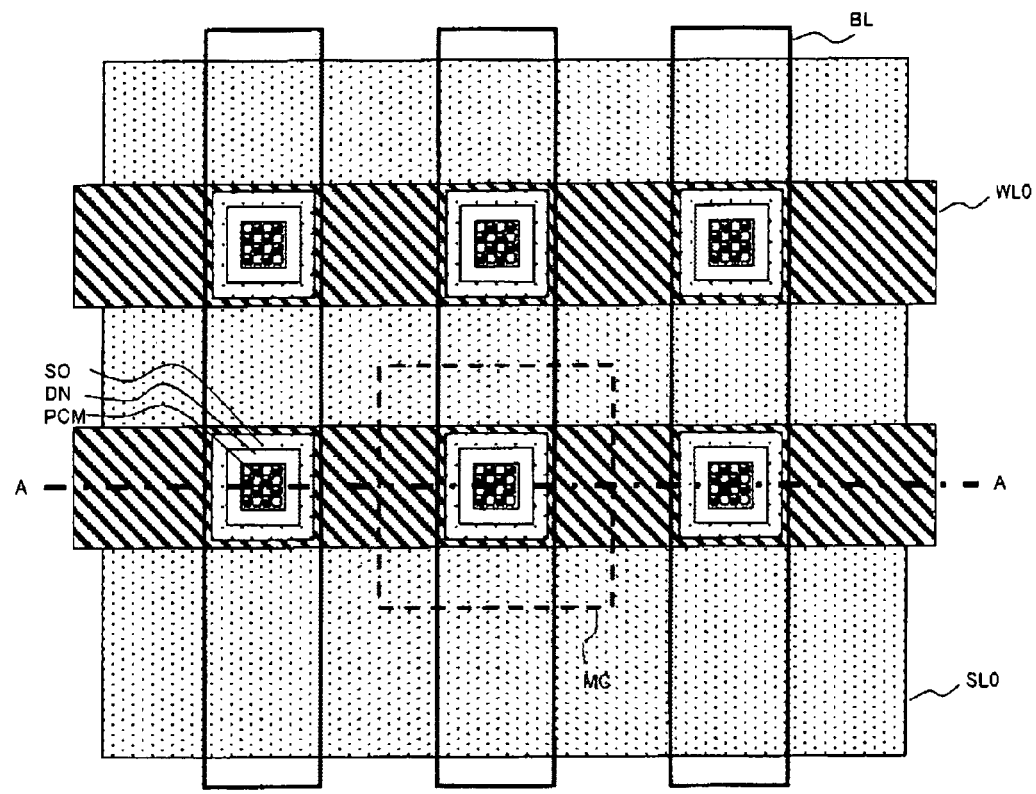
FIG. 2 is a plan view of the memory cell array of FIG. 1.

FIG. 1 shows a sectional view of a memory according to the present invention. FIG. 2 shows a plan view of the part below the bit line BL of the memory in FIG. 1. FIG. 1 corresponds to the A-A' cross section of the plan view in FIG. 2. In FIG. 1 and FIG. 2, there shown a structure in which memory cells MC are disposed, three cells in the direction of word lines WL and two cells in the direction of bit lines BL, and laminated in two layers in the vertical direction. The bit lines BL and the word lines WL are disposed at the minimum pitch 2F, therefore the area of the memory cell in each layer is 4F2. However, by laminating two layers of the memory cell, effective cell size is made to be 2F2, and compared with conventional methods, further high-integration is achieved.

A first layer of the memory has a structure in which a vertical transistor SV0, a phase-change resistor PCM0 which is a memory element, and a bit line BL are formed on a source electrode plate SL0 which is formed by a first wiring. The resistance value of the phase-change resistor PCM0 varies depending on the temperature subjected to a upper side of the vertical transistor SV2. A second layer of the memory has a structure in which the bit line BL of the first layer is shared, and a phase-change resistor PCM1, a vertical transistor SV1, and a source electrode plate SL1 are formed on the first layer. The resistance value of the phase-change resistor PCM1 varies depending on the temperature subjected to a lower side of the vertical transistor SV1. V2 denotes a via connecting the phase-change resistor PCM and the vertical transistor SV1, and the via may be omitted in the structure. In the present embodiment, SL is formed by a plate, however, it may be formed in a line shape. The vertical transistor SV comprises a channel part BDY, a source layer SC and a drain layer EN which are impurity-diffused layer, and a gate oxidized film SO. The vertical transistor SV is surrounded by the word line WL which is formed by a second wiring, and the word line WL serves as a gate electrode for the vertical transistor SV. The second wiring may be formed by polycrystalline silicon, or may be a metal layer.

The source layer SC is connected to the source electrode plate SL via a via layer V', and the drain layer EN is connected to the phase-change resistor PCM via the via layer V2. The via layer V2 is formed by, for example, tungsten or polycrystalline silicon. The vertical transistor SV may be either a vertical N-channel type MOS transistor or a vertical P-channel type MOS transistor. When a vertical N-channel type MOS transistor is employed, an N+ layer to which phosphorus is doped in high concentration of about $10^{20}/cm^3$ as an impurity is employed as impurity-diffused layers (SC and DN), and an impurity layer which has about $10^{16}/cm^3$ of boron as an impurity is employed as the channel part BDY. The adopted film thickness of the gate oxidized film SO is about 2 nm to 3 nm. The channel part HDY is subjected to annealing at 600° C. to 750° C. for 2 minutes to 12 hours after an amorphous silicon film is deposited. As a result, polycrystallization is carried out, and electric current allowed to pass through is increased. Annealing at low temperatures is possible when laser annealing is employed.

Phase-Change Resistor

Figure 3:
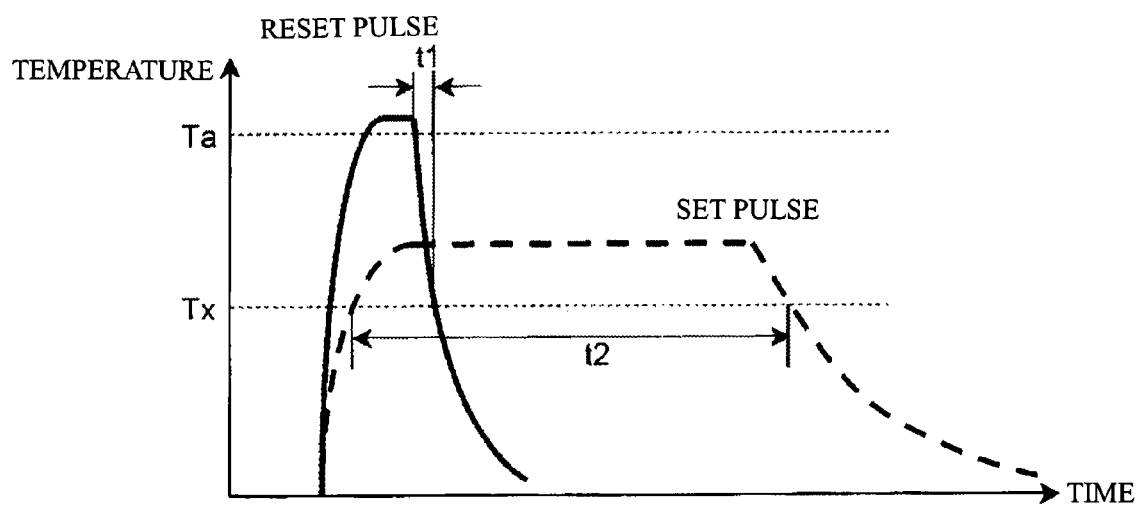
FIG. 3 is a schematic diagram of the method for writing-in to a phase-change resistor employed in FIG. 1.
Figure 4:
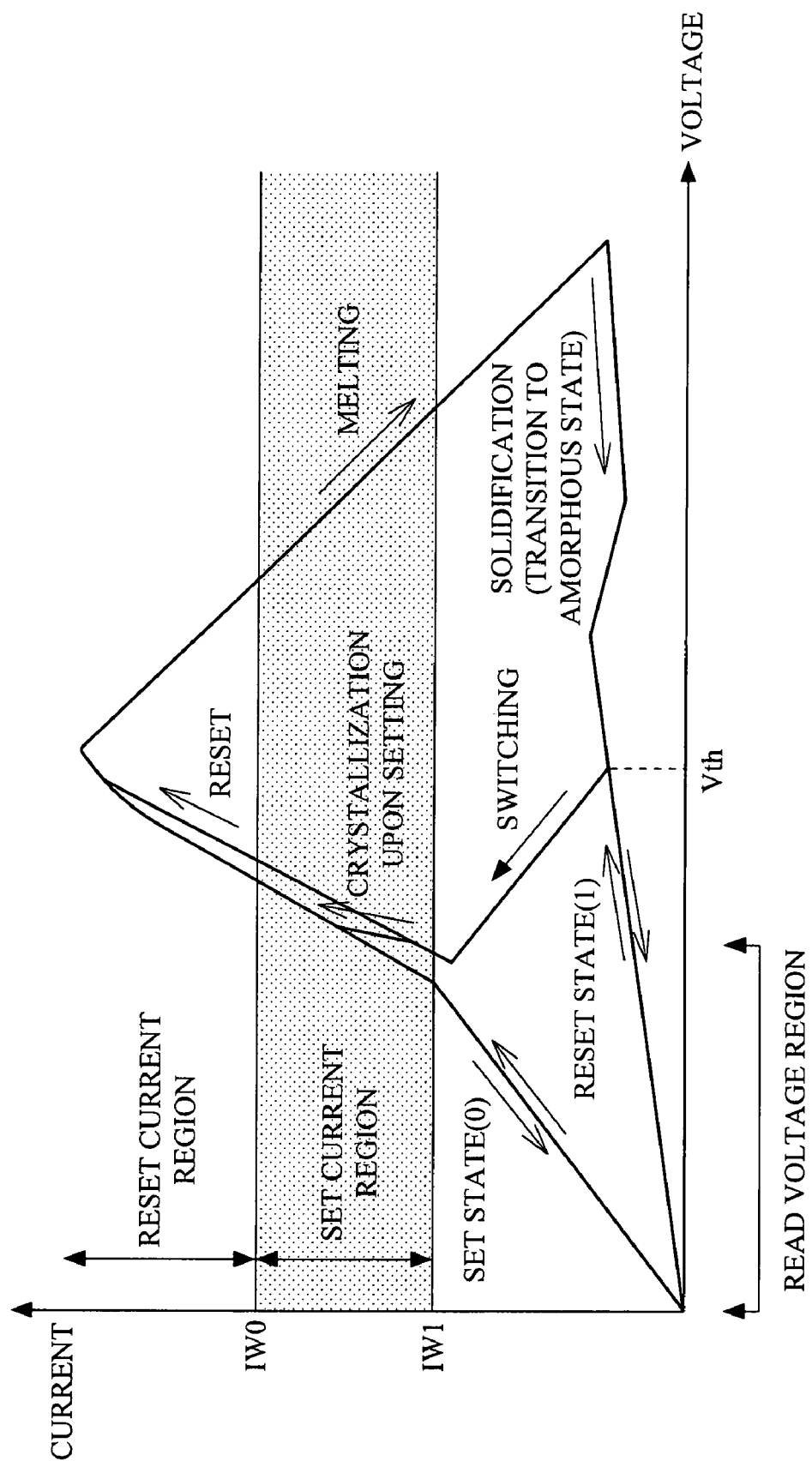
FIG. 4 is a diagram showing the property of the phase-change resistor employed in FIG. 1.

The phase-change resistor employs chalcogenide material such as Ge—Sb—Te based or Ag—In—Sb—Te based material including antimony (Sb) and tellurium (Te). When the memory data '1' is to be written into the phase-change resistor which is a memory element, as shown in FIG. 3, there applied a reset pulse which heats the resistor element equal to or over the melting point Ta of the chalcogenide material and carries out rapid cooling. The reset pulse is set short so as to reduce the overall applied energy, and the cooling time t1 is set short, for example, about 1 ns, and as a result, the chalcogenide material is made to be the amorphous state of high resistance. On the contrary, when the memory data '0' is to be written in, there applied a set pulse which maintains the phase-change resistor in the temperature region which is lower than the melting point, and same as the glass transition point or higher than the crystallization temperature Tx which is higher than the glass transition point. The chalcogenide material attains polycrystalline state of low resistance. The time t2 which is required for crystallization is, for example, about 50 ns, however, it varies depending on the composition and temperature of the chalcogenide material. The temperature of the element shown in the drawing depends on the Joule heat generated by the memory element itself and the thermal diffusion to the surrounding area. Therefore, as shown in the I-V properties in FIG. 4, the crystal condition of the memory element is controlled by applying current pulse having the value corresponding to the data to be written into the memory element. The drawing schematically shows the working principles of the memory element employing chalcogenide material, and shows that the memory data '0' is written in when the set current within the range of IW1 to IW0 is applied, and the memory data '1' is written in when the reset current equal to or above IW0 is applied. However, either state may be '0' or '1'. Four ways of writing-in operation will next be described in detail according to the drawing.

Firstly, in a case in which '0' is to be written into a memory element having '0' in the initial condition, when set current is applied, it traces the low resistance curve of set (crystalline) state, and travels back and forth between the initial condition and the set region, therefore, the state is maintained. Secondly, in a case in which '1' is to be written into a memory element having '0' in the initial condition, when reset current is applied, it traces the low resistance curve of the set state and reaches the reset current. Next, the electric conductivity gradually decreases since melting partially begins because of Joule heat. When the melting further progresses, high resistance state is attained. When the memory element in a liquid phase is rapidly cooled, it changes the phase to the amorphous state, therefore, it traces the high-resistance curve of reset (non-crystalline) state which is somewhat lower than the resistance in the liquid phase, and returns to the initial condition. Thirdly, in a case in which '0' is to be written into a memory element having '1' in the initial condition, when set current is applied and the terminal voltage of the memory element exceeds the threshold voltage Vth, it switches to the low resistance state. After the switching, crystallizing progresses because of Joule heat. When the current value reaches that of the set current, crystallized region is broaden and the phase changes. As a result, the resistance value further decreases, therefore, it traces the low resistance curve and returns to the initial condition. Fourthly, in a case in which '1' is to be written in to a memory cell having '1' in the initial condition, crystallization is carried out after the above described switching, and it traces the low resistance curve, as a result of switching, reaches the reset region, and after undergoing melting, rapid cooling, and solidification, returns to the initial condition.

Based on the above described working principles of the memory element, when read-out is carried out, the operation has to be carried out while the voltage is restrained such that the highest voltage is lower than the threshold voltage Vth so that the memory data is not destroyed. Practically, the threshold voltage Vth depends on the voltage-applying time upon reading-out and writing-in, and tends to decrease when the time is long. Therefore, the voltage have to be set such that switching to the low resistance state does not occur by exceeding the threshold voltage within the reading-out time.

Memory Block Structure

Figure 5:
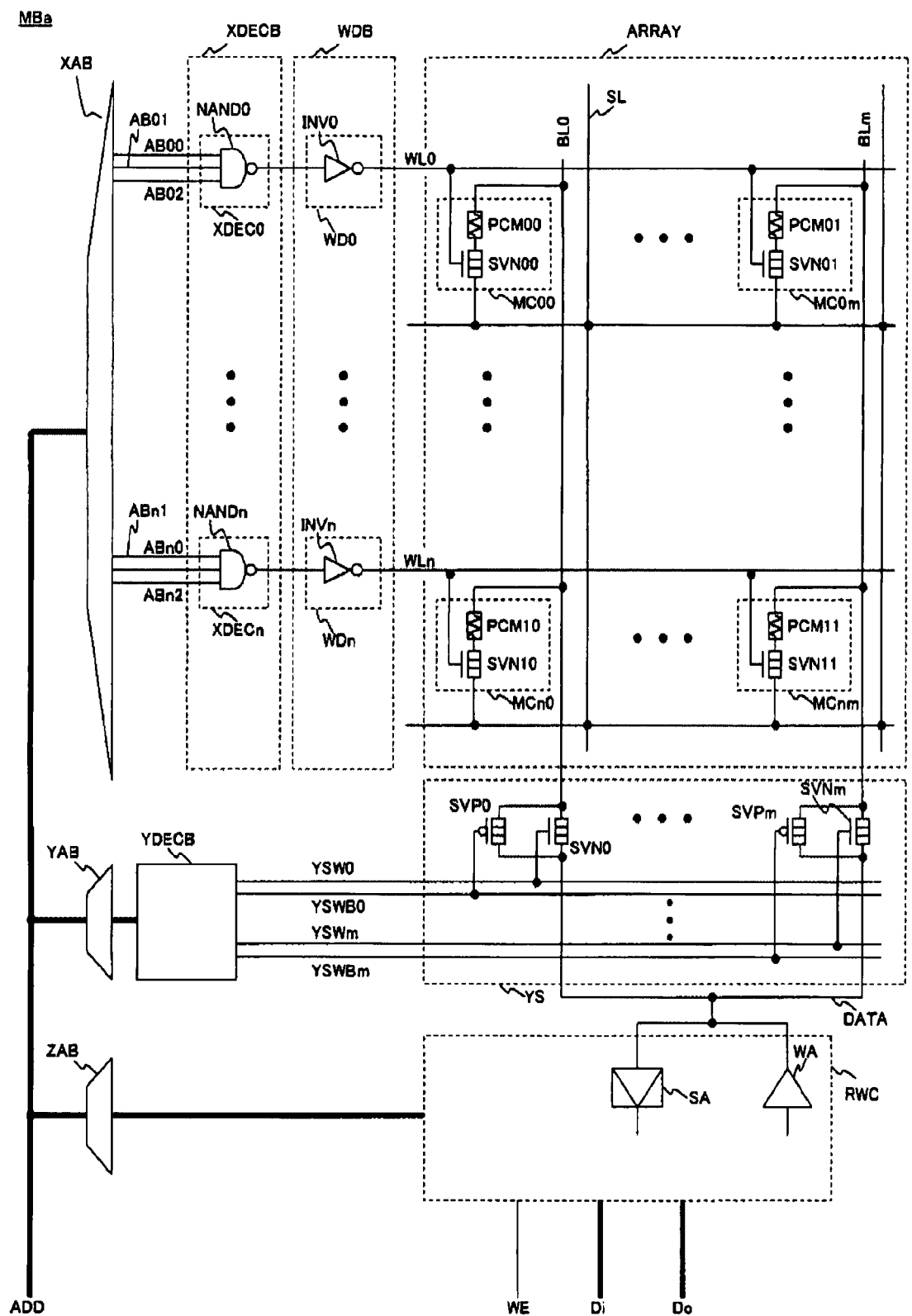
FIG. 5 is a circuit diagram showing an embodiment of a memory block which includes FIG. 1.

For example, a memory block MBa which is a layer of a memory array shown in FIG. 1, will be described in detail by use of FIG. 5. A memory array ARRAY comprises plural word lines WL, plural bit lines BL, and a source electrode plate SL covering the memory array, and memory cells MC are connected to the intersecting point of the word lines WL and the bit lines BL. The source electrode plate SL is comprised of a plate, however, in the circuit diagram of FIG. 5, it is shown as a mesh wiring for convenience. Each of the memory cells MC comprises, as exemplified by a memory cell MC00, a vertical N-channel type MOS transistor SVN00 and a memory element PCM00. The memory element PCM00 is, for example, an element called phase-change resistor which is an element characterized by having, for example, low resistance of about 1 k$\Omega$ to 10 $\Omega$Q in the crystalline state, and high resistance of 100 k$\Omega$ or more in the amorphous state. A word line WL0 is connected to the gate electrode of the vertical N-channel type MOS transistor SVN00, and controlled so as to attain an on-state in the state selecting the vertical N-channel type MOS transistor, and off-state in the non-selecting state of the transistor. One end terminal of PCM00 is connected to a bit line, and the source electrode of SVN00 is connected to the source electrode plate SL.

Word driver circuits (WD0, . . . , WDn) are connected to the word lines WL. For example, the word driver circuit WD0 comprises an inverter circuit INV0 which is comprised of a vertical P-channel type MOS transistor and a vertical N-channel type MOS transistor. The word driver circuits (WD0, . . . , WDn) are arranged in the vertical direction and form a word driver block WDB. An X-address decoder block XDECB which comprises X-address decoders (XDEC0, . . . , XDECn) is disposed next to the word driver block WDB.

For example, the X-address decoder XDEC0 comprises a 3-input NAND circuit which comprises a vertical P-channel type MOS transistor and a vertical N-channel type MOS transistor, and selects the word line WL0 in accordance with the address signals (AB00, AB01, and AB02). These address signals are input from an X-address buffer block XAB.

A column selection circuit YS is connected to bit lines (BL0, BLm). For example, the bit line BL0 is connected to a vertical P-channel type MOS transistor SVP0 and a vertical N-channel type MOS transistor SVN0, and selectively connected to the data line DATA in accordance with controlling signals (YSW0 and YSWB0). When the access speed is not concerned about, either one of the vertical P-channel type MOS transistor SVP0 or the vertical N-channel type MOS transistor SVN0 may be employed solely. The controlling signals YSW are produced by a Y-address decoder block YDECB. The address signals are given from a Y-address buffer block YB to the Y-address decoder block YDEC.

A read/write circuit RWC comprises a sense amplifier circuit SA and a write amplifier circuit WA. The sense amplifier circuit SA is activated by an activation signal and amplifies the signals in the data line DATA. The write amplifier circuit WA is activated by an activation signal and outputs written-data to the data line DATA. A Z-address which selects a layer of a memory block is sent to the read/write circuit RWC through a Z-address buffer block ZAB. When a memory block layer is selected, data is output to "Do" upon reading-out, and data is taken in from "Di" upon writing. A writing controlling signal WE is also input to the read/write circuit RWC. The memory cell MC used herein may have a structure other than that shown in FIG. 1 and FIG. 2.

Since the memory block MBa comprises only the vertical MDS transistors, memory elements, and wirings connecting them, the memory block may be formed only by polycrystalline silicon layers, wiring layers, and memory element layers. When tungsten or polycrystalline silicon layer is employed in the wiring layers, formation of all layers can be carried out at 600° C. or less, and these layers have heat resistance of 600° C. or more. Therefore, plural layers can be laminated so as to increase degree of integration, unlike conventional memories that are formed by employing CMOS disposed on a silicon substrate.

Figure 6:
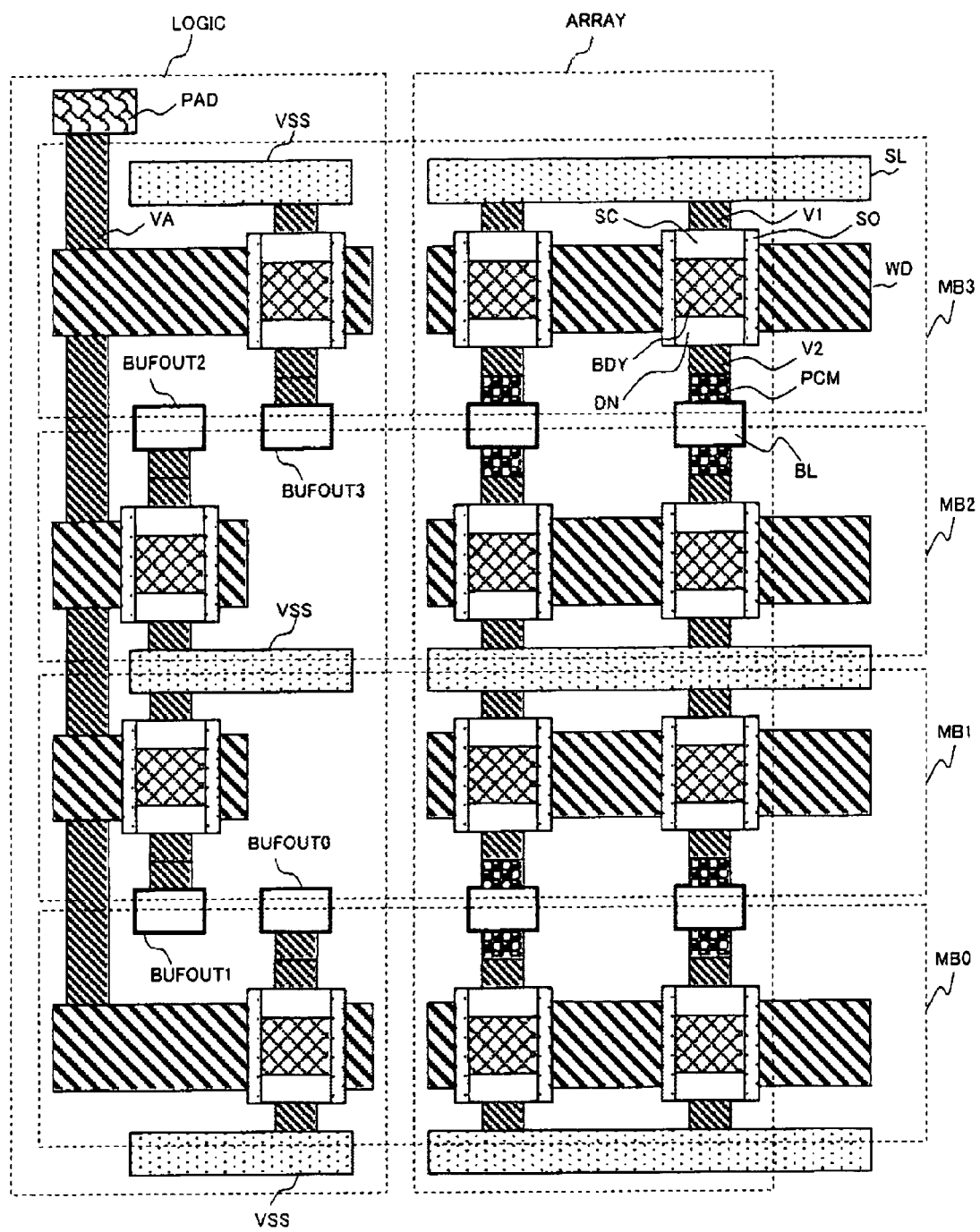
FIG. 6 is a cross section of a memory chip in which the memory blocks of FIG. 5 are laminated.

A cross section of a case in which four layers (MB0, MB1, MB2, and MB3) of memory blocks MBa are laminated on a silicon substrate Si is shown in FIG. 6. Each of the memory block layers MB has a memory size of 4F2. However, by laminating four layers, effective cell size is made to be 1F2, and integration degree which is eight times that of DRAM is achieved. As a result, the cost per bit competing with hard disk devices is achieved. Each of the memory block layers (MB0, MB1, MB2, and MB3) comprises a memory array ARRAY part and peripheral circuits LOGIC such as a word driver. An input PAD which inputs addresses ADD is formed in the uppermost layer separately from the memory block layers (MB0, MB1, MB2, and MB3), and the input address ADD is input to the gate of each layer via a wiring VA which vertically penetrates the memory block layers. The peripheral circuit part LOGIC which is shown in FIG. 6 shows a part of an address buffer block AB.

The vertical transistors employed in the peripheral circuit part LOGIC, are same as those employed in memory cell part, however, the parts of the memory elements PCM are replaced by via V2. MB1 and MB3 have upside-down structures of MB0 and MB2, and MB0 and MB1 share bit lines BL. MB1 and MB2 share a source electrode plate SL, and MB2 and MB3 also share bit lines BL. Therefore, the production process is simplified and low cost is achieved.

Since the bit lines BL are shared by upper and lower memory block layers MB, the word line WL of the selected memory block layer MB has to be solely activated, and this is easily carried out by taking AND of the output signal of the Z-address buffer block ZAB and that of X input by X-DEC.

Figure 7:
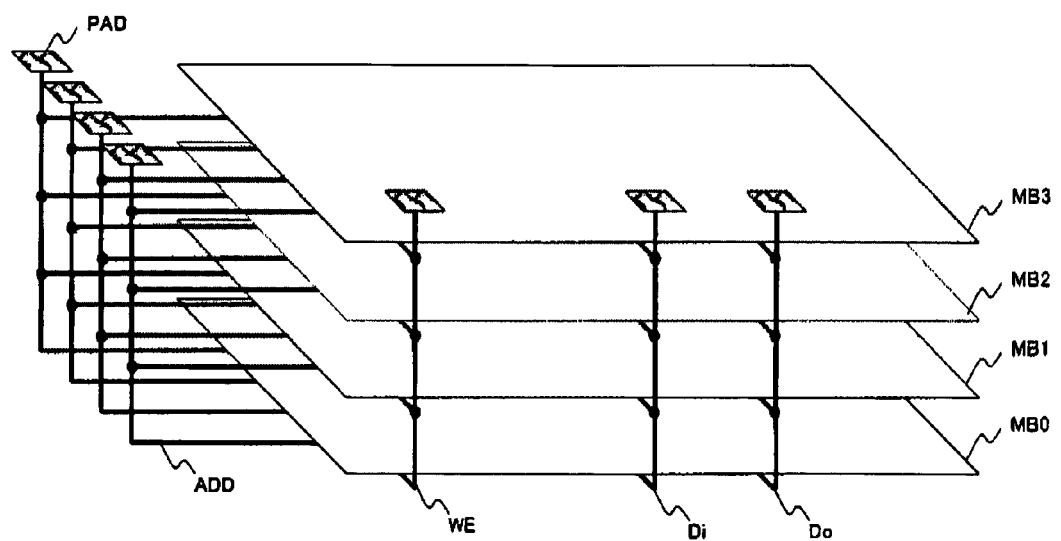
FIG. 7 is a bird's-eye view of FIG. 6.

A bird's eye view is shown in FIG. 7. The number of wirings of the addresses ADD, writing controlling signal WE, and data (Di and Do) may be in different structure depending on the integration degree and structure of the memory.

Operation Method

Figure 8:
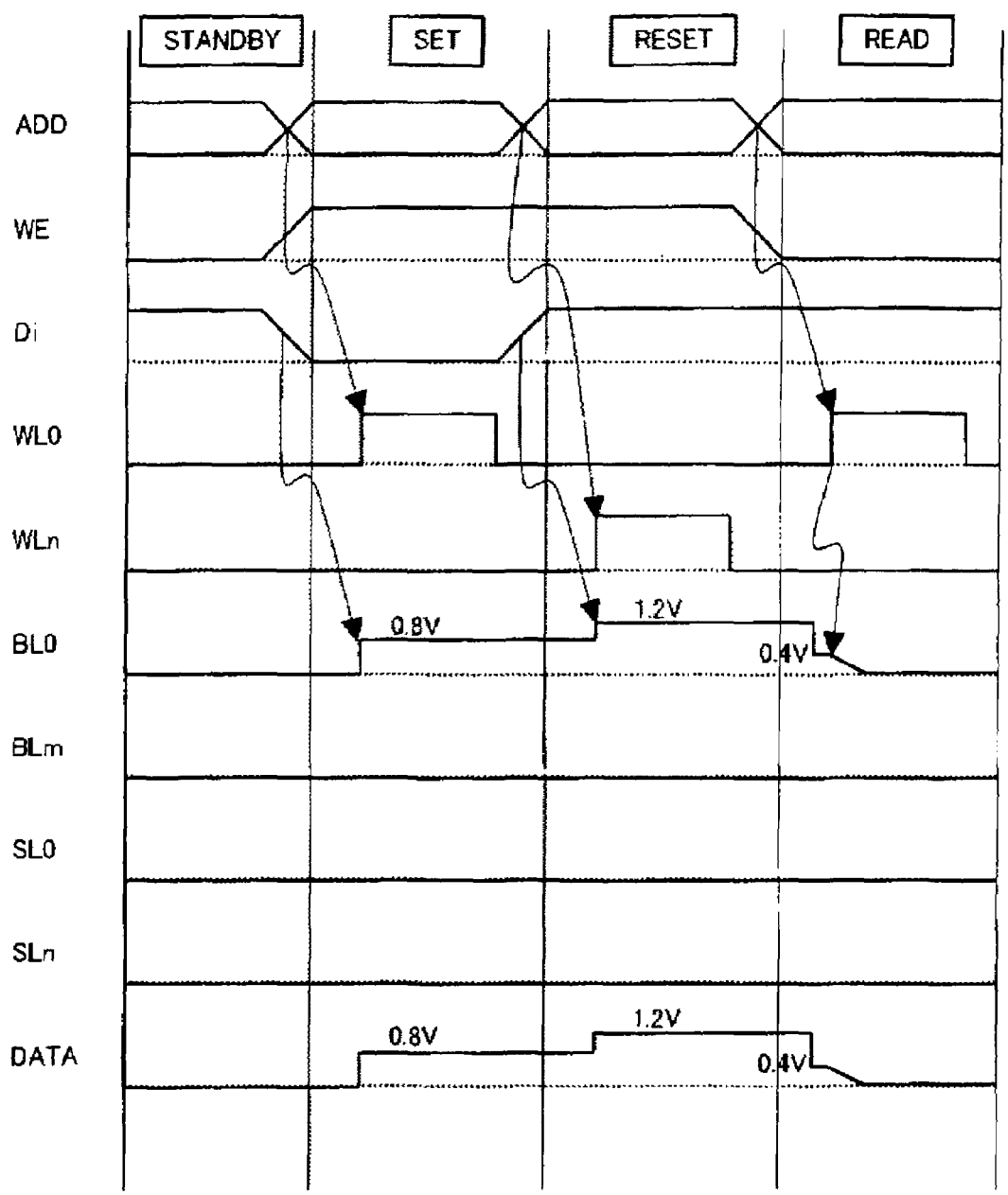
FIG. 8 is an operation wave form diagram of the memory chip shown in FIG. 6.

Next, detailed operation will be explained by use of FIG. 8. The power supply voltage is, for example, 1.2 V. At first, standby state STANDBY is maintained, and when the address ADD is switched and the writing controlling signal WE becomes 'H', writing operation is started. Firstly, the SET operation in which '0' is written in to the memory cell MC00 will be explained. A data Di which is to be written in becomes 'L', and the bit line BL0 is driven by the column selection circuit YS and the read/write circuit RWC. At the same time, the word line WL0 is selected by the X-address decoder XDEC0 and the word driver circuit WD0. In the SET operation of the present embodiment, when 0.8 V is applied to the bit line BL0, the source line SL0 is maintained at 0 V, and the element maintains high resistance; about a several microampere of current keeps flowing. The voltage difference may be a smaller value or a larger value of the power supply voltage. By maintaining this condition for 100 nanoseconds to several microseconds, the memory element PCM00 crystallizes and the resistance is lowered. Meanwhile, same voltage is applied to an element which already has low resistance. The non-selected bit line BLm is set at ground potential by an unillustrated circuit.

After the writing is completed, the word line WL0 slowly transits from 'H' to 'L' and the SET operation is completed. Next, a RESET operation in which '1' is to be written in to the merry cell MCn0 will be explained. The address is changed, the data Di to be written in becomes 'H', and the bit line BL0 is driven by the column selection circuit YS and the read/write circuit RWC. At the same time, a word line WLn is selected by an X-address decoder XDECN and a word driver circuit WDn. In the RESET operation, for example, when the potential of the bit line BL0 is 1.2 V, the source line SL0 is maintained at 0 V, and the element has low resistance; the current of about several tens of microampere keeps flowing from the bit line BL0 to the source line SL0. When this state is maintained for 5 nanoseconds to several tens of nanoseconds, the element attains melted state. Then, the word line WLn is caused to transit from 'H' to 'L', and the voltage applied to the element is rapidly lowered so as to carry out rapid cooling. This rapid cooling causes transition of the memory element PCM10 to amorphous state thereby attaining high resistance. Meanwhile, the same voltage is applied to an element which already has high resistance. At this time, the current of several microampere or more flows in the element. However, when the time is about several tens of nanoseconds, the resistance of the element does not change thereby causing no problem. The non-selected bit line BLm is, although unillustrated, connected to ground potential.

Next, a READ operation which is a reading-out operation is explained in a case in which written in data '0' is read out from the memory cell MC00. When the address ADD is changed and the writing controlling signal WE becomes 'L', the reading-out operation begins. The bit line BL0 and the data line DATA are precharged to, for example, 0.4 V by the column selection circuit and the read/write circuit RWC. Then, the word line WL0 is activated from 'L' to 'H' by the X-address decoder XDEC0 and the word driver circuit WD0, and current is caused to flow from the bit line BL0 toward the source line SL0. A low resistance value has been written in the memory cell MC00, therefore, the bit line BL0 and the data line DATA are discharged so as to be 0 V. If a high resistance value is written in to the memory cell MC00, the bit line BL0 undergoes little change and 0.4 V is maintained. This difference in the voltage is amplified and detected by the read/write circuit RWC, the detected data is output to "Do", and reading-out is completed. In order to carry out amplification, a reference voltage of, for example, about 0.2 V is produced, when reading-out of low resistance is carried out, the difference between 0 V and 0.2 V is amplified to output data '0'. When reading-out of high resistance is carried out, the difference between 0.2 V and 0.4 V is amplified to output data '1'. Meanwhile, the non-selected bit line BLm is connected to ground potential.

The voltage 0.4 V and 0.8 V as the bit line voltage required for writing, and the voltage 0.2 V as a reference voltage required for reading, are generated by use of a voltage converter. A voltage converter is a known art and comprised of a circuit for generating reference voltage and a circuit for outputting voltage.

Embodiment 2

In Embodiment 1, a memory block layer comprised of only vertical MOS transistors are laminated, however, a part of the circuit of the memory block layer may be disposed on silicon substrate Si. In this embodiment, a case in which an address buffer block AB, Y-address decoder block YDECB, and read/write circuit RWC are disposed on a silicon substrate Si, is explained. Herein, a Z-circuit is configured so as to be integrated with a Y-circuit.

Figure 9:
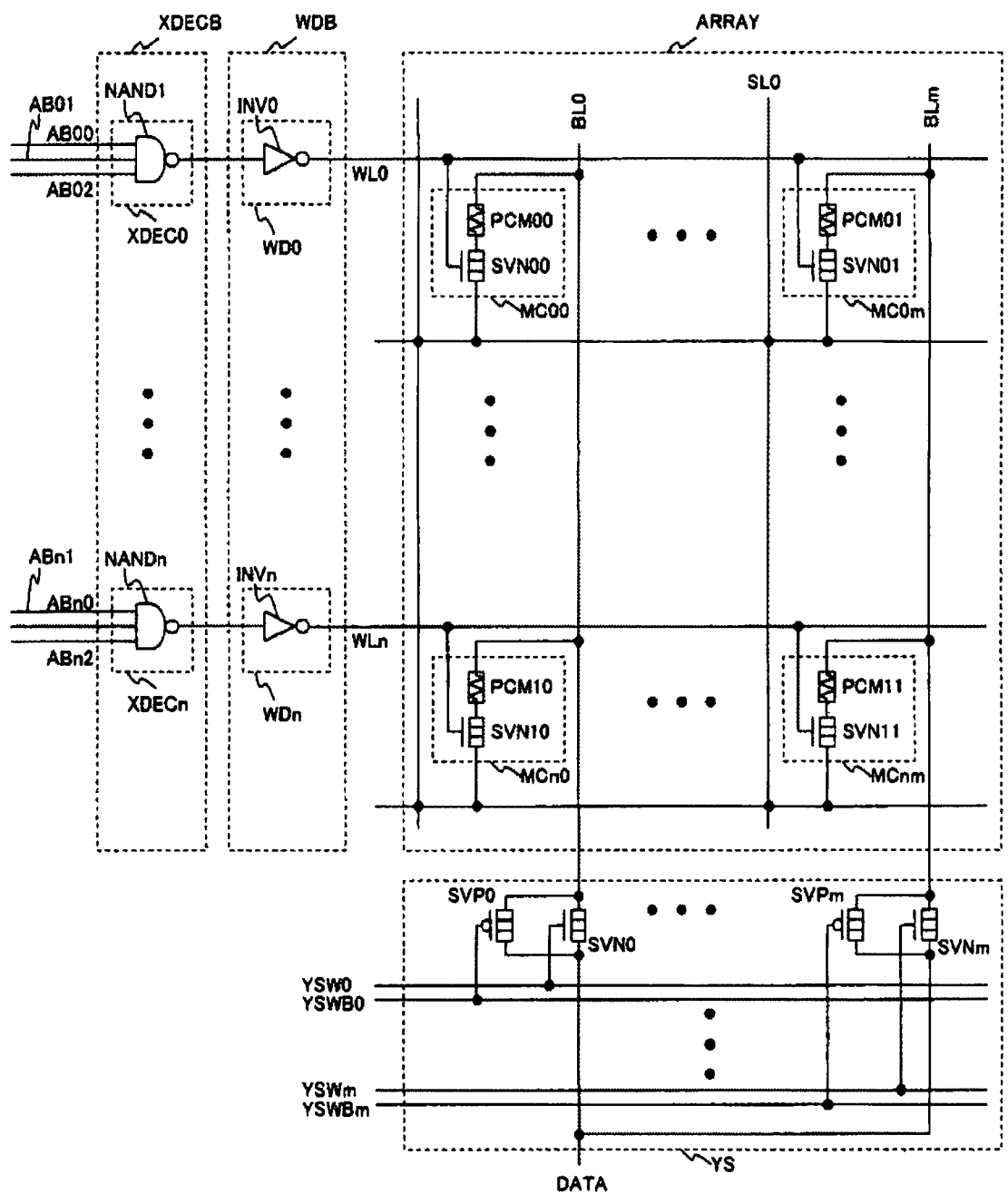
FIG. 9 is a circuit diagram of a memory block according to Embodiment 2.

A detailed circuit diagram of a memory block layer MBb is shown in FIG. 9. The memory block layer MBb is comprised of only a memory array ARRAY, an X-address decoder block XDECB, a word driver block WDB, and a column selection circuit YS, with the indirect peripheral circuit removed from the memory block layer described in Embodiment 1. All circuits are formed by employing vertical transistors.

Four layers (MB0, MB1, MB2, and MB3) of the memory block layer MLb are laminated on a silicon substrate Si, and peripheral circuits are formed by common CMOS transistors on the silicon substrate Si. Each of the memory block layers MBb has a memory cell size of 4F2. However, by laminating four layers, effective cell size is made to be 1F2, and integration degree about eight times that of DRAM is achieved. As a result, the cost per bit competing with hard disk devices is achieved.

Figure 10:
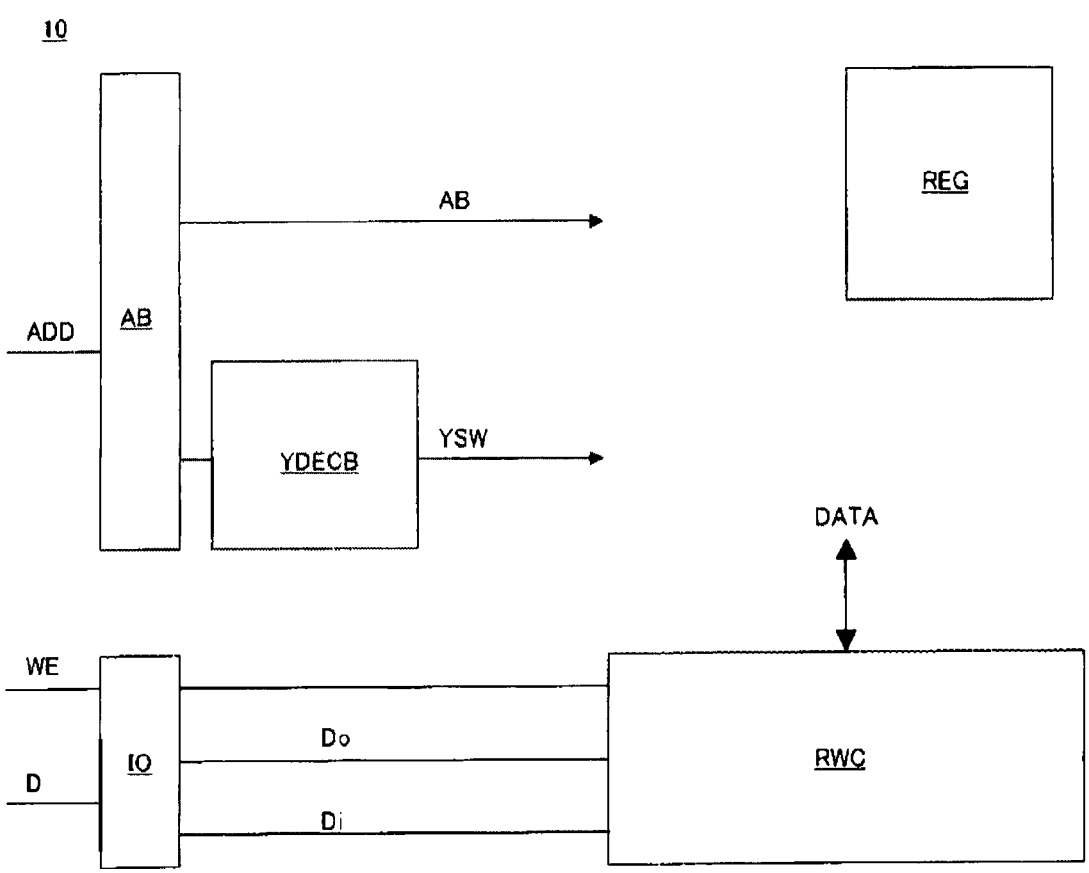
FIG. 10 is a block diagram of the circuit formed on the substrate of FIG. 9.

The circuits formed on the silicon substrate Si are, as shown in FIG. 10, for example, an address buffer block AB, an input/output circuit IO, a Y-address decoder block YDECB, a read/write circuit RWC, and a voltage converter REG. An address ADD is input to the address buffer block AB from outside. A writing controlling signal WE and data D is input to the input/output circuit IO from outside. To each of the memory block layers (MB0, MB1, MB2, and MB3), the address signal AB is input from the address buffer block AB, a controlling signal YSW is input from YDECB, and data of the data line DATA is input from RWC.

Figure 11:
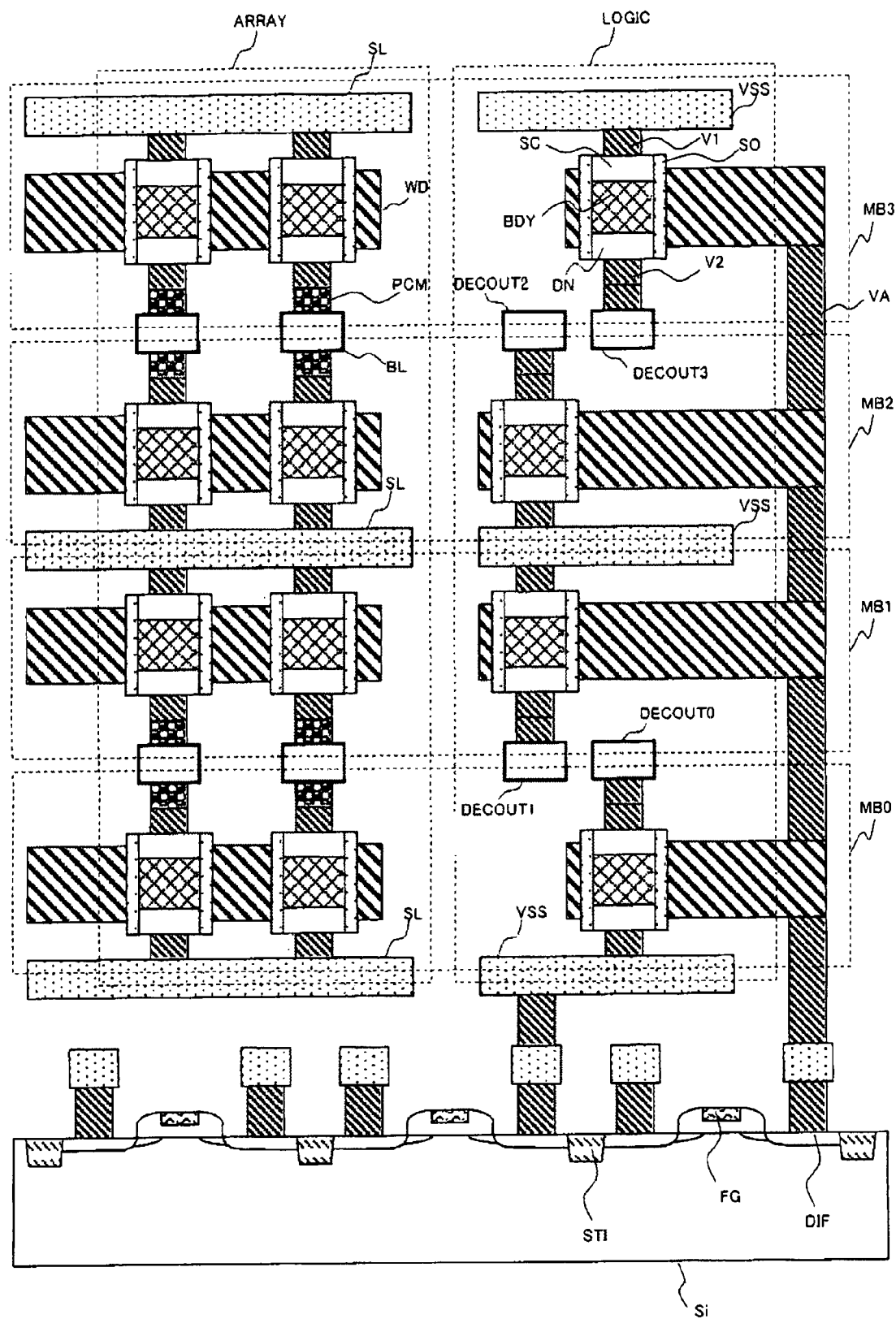
FIG. 11 is a cross section of the memory chip in which the memory blocks of FIG. 9 are laminated.

FIG. 11 is a cross section of the present semiconductor memory device. Four memory block layers (MB0, MB1, MB2, and MB3) are laminated on the silicon substrate Si, and each layer comprises a memory array ARRAY and peripheral circuits LOGIC. Normal MOS transistors are formed on the silicon substrate Si. The MOS transistors are separated by element separation layers STI, and each transistor comprises a gate electrode FG, and diffusion layers DIF forming a source electrode and a gate electrode. The signals from the silicon substrate Si are input to each layer of the memory blocks MB through a via VA which is vertically penetrating the layers.

Figure 12:
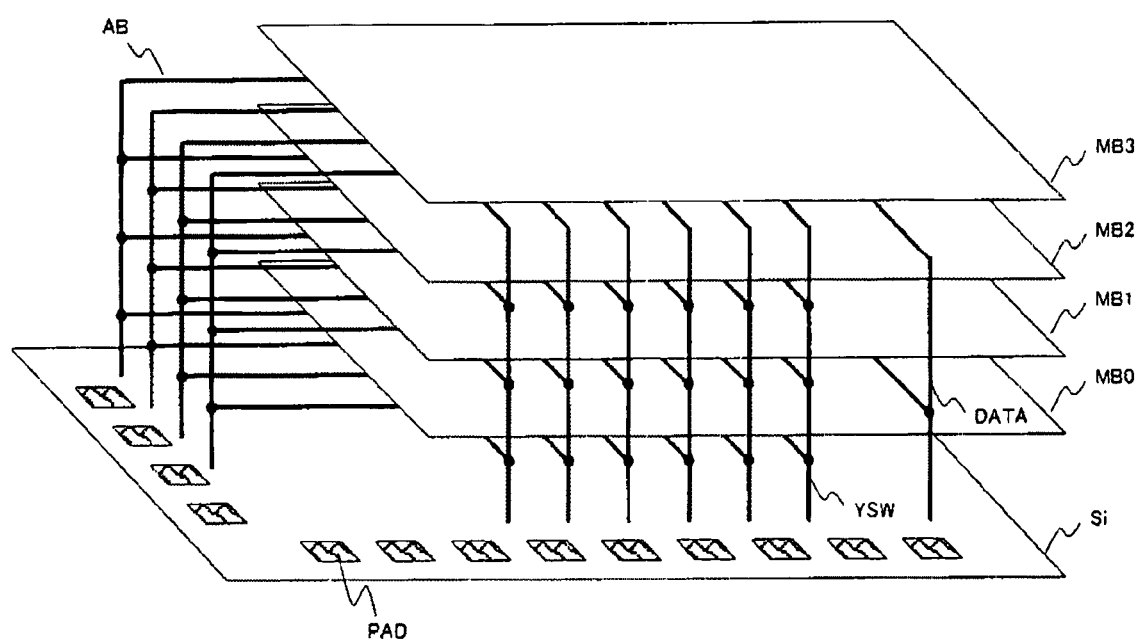
FIG. 12 is a bird's-eye view of FIG. 11.

The bird's-eye view is shown in FIG. 12. The address signal AB, the controlling signal YSW, and the wiring number of the data DATA, varies depending on the integration degree and structure of the memory.

Embodiment 3

Plan View and Sectional View

The vertical transistor referred to in Embodiment 1 is left floating since no electricity is fed to the channel part BDY. Therefore, the electric potential is unstable, and the history effect in which the threshold of the transistor is varied becomes a problem. Therefore, an example in which electricity is fed to the channel part of a transistor will be explained.

Figure 13:
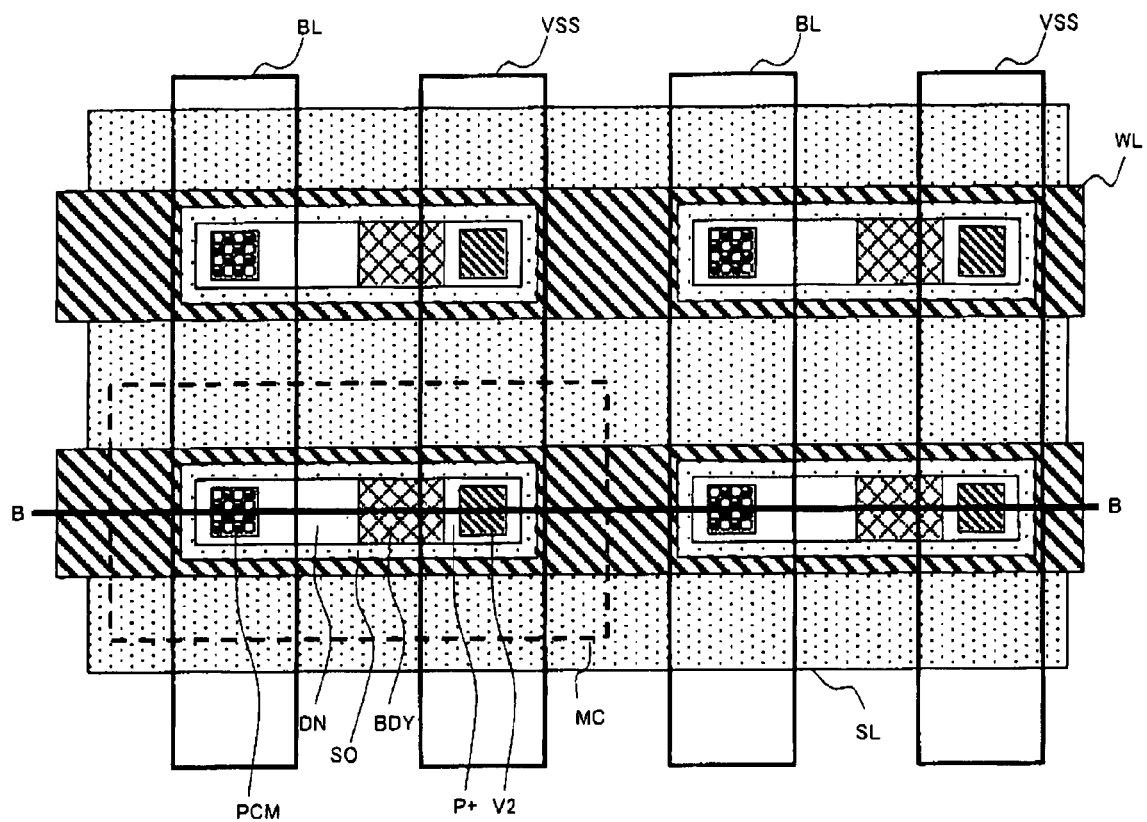
FIG. 13 is a plan view of a memory cell array according to Embodiment 3.
Figure 14:
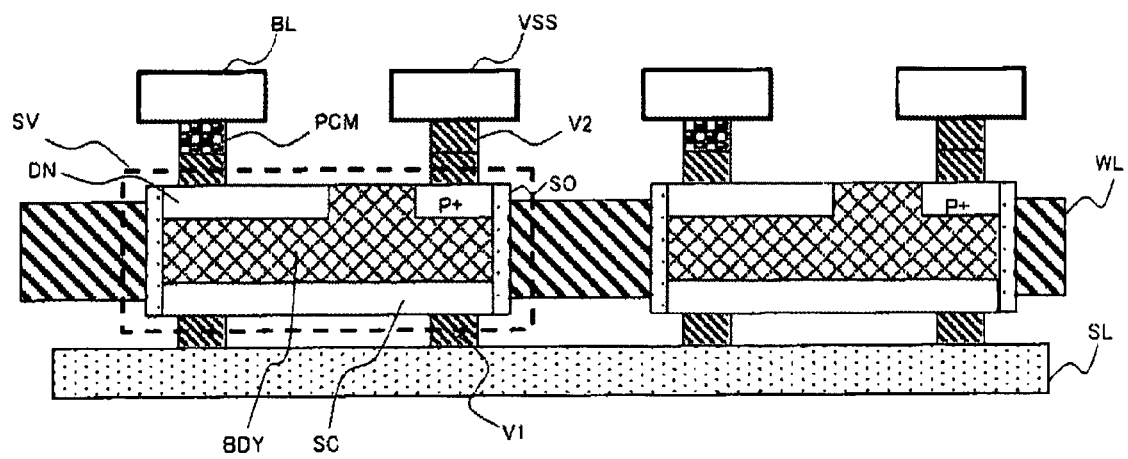
FIG. 14 is a cross section of the memory cell array of FIG. 13.

FIG. 13 shows a plan view of a memory array of the present embodiment. The shown memory array has two cells in the direction of word lines WL, and two cells in the direction of bit lines BL. A memory cell MC comprising a vertical transistor and a memory element is disposed on the intersecting point of the word line WL and the bit line BL. The bit line BL is disposed with a pitch of 4F, and the word line WL is disposed with a pitch of 2F, therefore, the area of a memory cell becomes 8F2 which is double comparing with that in Embodiment 1. The cross section taken from B-B' of the plan view is shown in FIG. 14. A source electrode plate SL is formed by a first wiring, and a vertical transistor SV and a phase-change resistor PCM which is a memory element are formed on the plate.

The vertical transistor SV comprises a channel part BDY, a source layer SC and a drain layer EN which are impurity diffusion layers, a gate oxidized film SO, and an electricity feeding diffusion layer P+. The vertical transistor SV is surrounded by a word line WL which is formed by a second wiring, and the word line WL serves as a gate electrode wiring of the vertical transistor SV. The source layer SC is connected to a source line SL via a via layer V1, and the drain layer DN is connected to the phase-change resistor PCM via a via layer V2. The phase-change resistor is also connected to the bit line BL. The electricity feeding diffusion layer P+ is connected to a ground potential line VSS via the via V2. The vertical transistor SV may be a vertical N-channel type MOS transistor or a vertical P-channel type MOS transistor MP. When a vertical N-channel type MOS transistor is employed, N+ layers to which phosphorus is doped in a high concentration of about $10^{20}/cm^3$ as an impurity are employed as impurity diffusion layers (SC and EN), and an impurity layer having boron at about $10^{16}/cm^3$ as an impurity is employed as the channel part BDY. A P+ layer to which boron is doped in a high concentration of about $10^{20}/cm^3$ as an impurity is employed as the electricity feeding diffusion layer P+.

By providing the above described structure, the electric potential of the channel part BDY of the vertical transistor is stabilized, and stabilized current can be obtained. In this method, the bit line BL is shielded by the ground potential line VSS, and noises to the bit line BL can be reduced. Such transistor is effective not only in a memory cell but also in a sense amplifier and a paired transistor of a power supply circuit.

Figure 15:
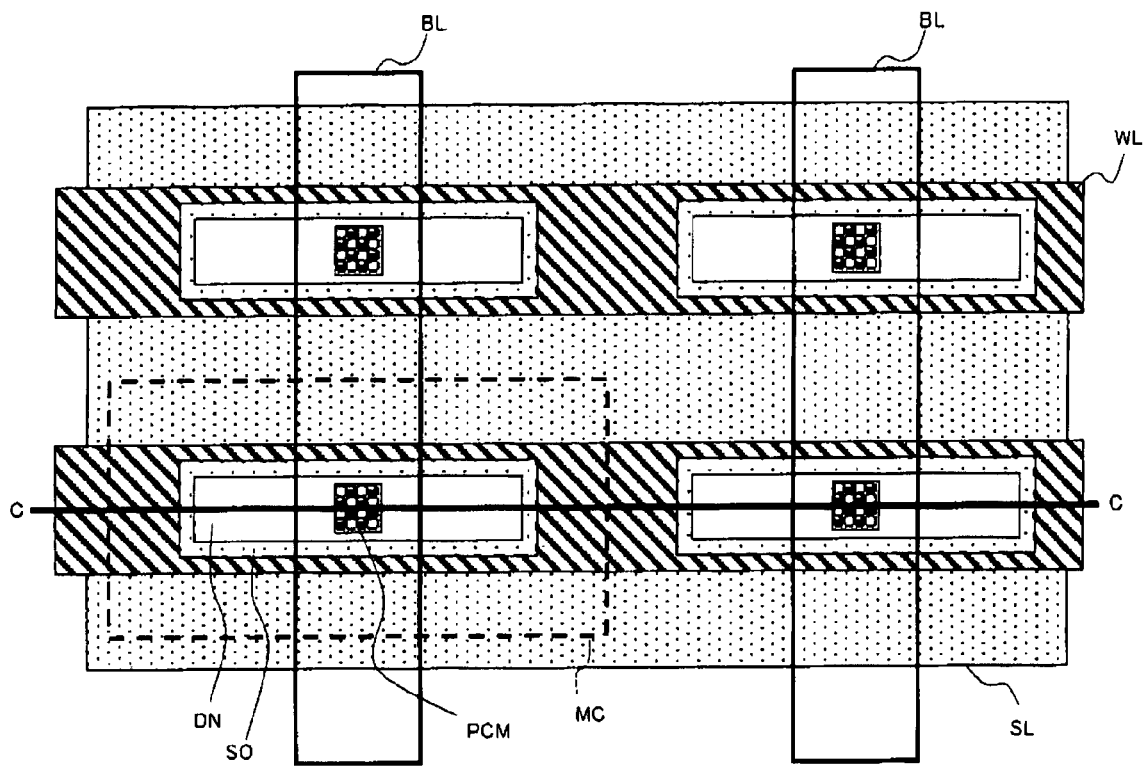
FIG. 15 is a plan view of another memory cell array according to Embodiment 3.
Figure 16:
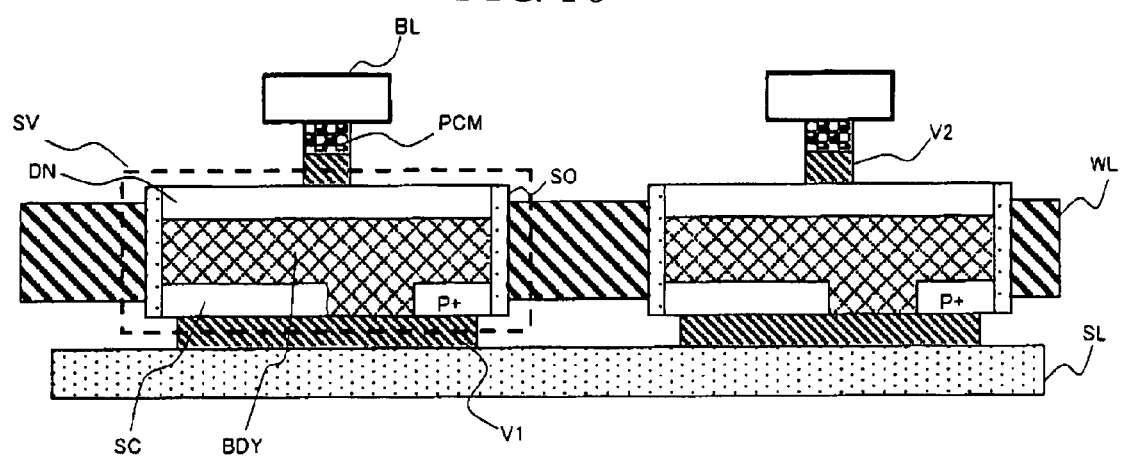
FIG. 16 is a cross section of the memory cell array of FIG. 15.

FIG. 15 shows a structure in which the electricity feeding diffusion layer P+ is forced in the bottom of the vertical transistor SV, and VSS and SL are integrated. The cross section taken from C-C' of the plan view is shown in FIG. 16.

Figure 17:
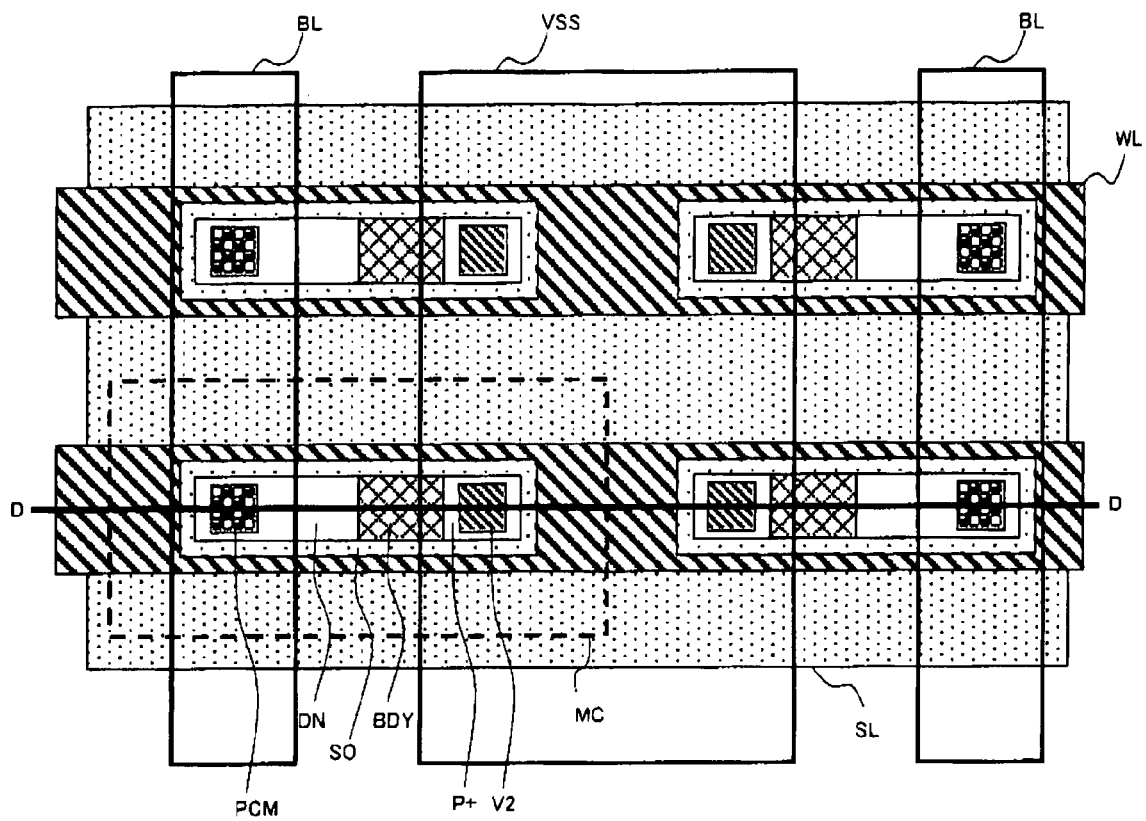
FIG. 17 is a plan view of another memory cell array according to Embodiment 3.
Figure 18:
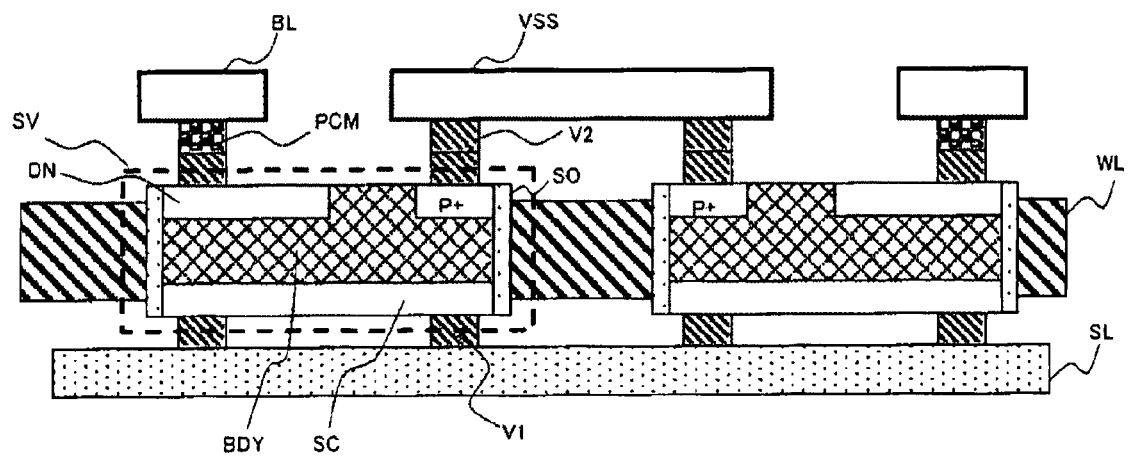
FIG. 18 is a cross section of the memory cell array of FIG. 17.

Further, an example of a cell which is modified so as to reduce the power supply noise is shown in FIG. 17. The cross section taken from C-C' of the plan view is shown in FIG. 18. The structure is almost the same as that in FIG. 13 except that a ground potential VSS is shared by two cells.

Embodiment 4

Figure 19:
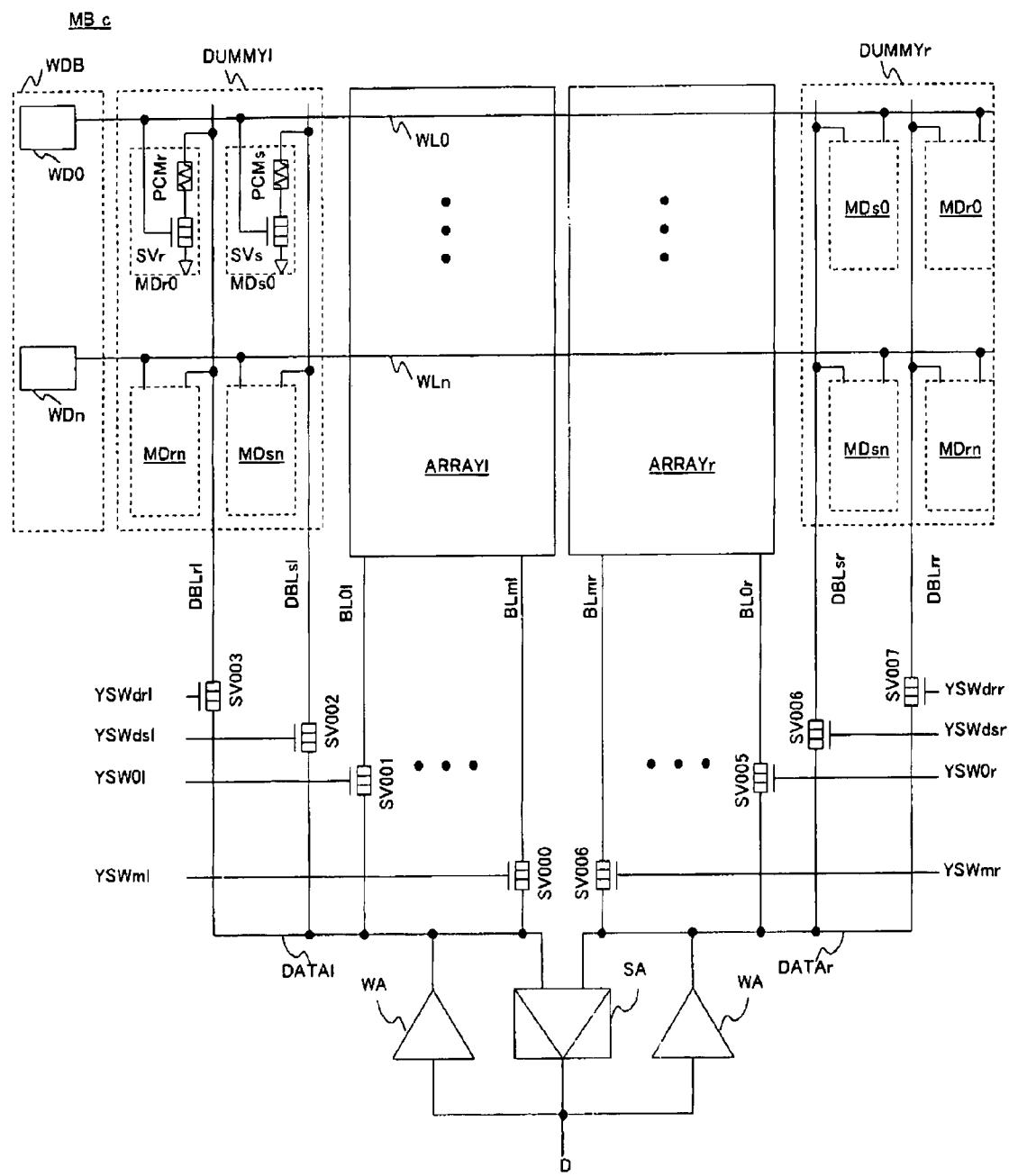
FIG. 19 is a circuit diagram of a memory block according to Embodiment 4.

A case in which the memory block MB referred to in Embodiment 1 has a different structure is explained by using FIG. 19.

Memory Block Structure

The memory array of a memory block MBc is separated into two memory arrays (ARRAY1 and ARRAYr). Each array comprises plural word lines and plural bit lines, and memory cells are connected at the intersecting points of the word lines and the bit lines. Each memory cell comprises a vertical N-channel type MOS transistor and a memory element. The memory element is, for example, an element called phase-change resistor.

Word driver circuits (WD0 and WDn) are connected to the word lines (WL0 and WLn). The word driver circuits (WD0 and WDn) are disposed in an array to form a word driver block WDB.

Dummy arrays (DUMMY1 and DUMMYr) are disposed on the both sides of the memory arrays (ARRAY1 and ARRAYr). Each of the dummy arrays (DUMMY1 and DUMMYr) is comprised of two columns. One column comprises dummy cells (MDr0, . . . , MDm), and the other column comprises dummy cells (MDs0, . . . , MDsn).

For example, the dummy cell MDr0 comprises a vertical N-channel type MOS transistor SVr and a phase-change resistor PCMr. The dummy cell MDr0 is connected to the word line WL0 which is shared with the memory array ARRAY, and to a dummy bit line DBLr1. A high resistance is always written into a phase-change resistor PCMr.

The dummy cell MDs0 comprises a vertical N-channel type MOS transistor SVs and a phase-change resistor PCMs. The dummy cell MDs0 is connected to the word line WL0 which is shared with the memory array ARRAY, and to a dummy bit line DBLq1. A low resistance is always written into a phase-change resistor PCMs.

The dummy bit line DRLr1 is connected to a data line DATA1 via a vertical transistor SV003. A controlling signal YSWdr1 is connected to the gate electrode of the vertical transistor SV003. The dummy bit line DBLs1 is connected to the data line DATA1 via a vertical transistor SV002. A controlling signal YSWds1 is connected to the gate electrode of the vertical transistor SV002.

In the same manner, a dummy bit line DBLrr is connected to the data line DATAr via a vertical transistor SV007. A controlling signal YSWdrr is connected to the gate electrode of the vertical transistor SV007. The dummy bit line DBLSr is connected to the data line DATAr via a vertical transistor SV006. A controlling signal YSWdsr is connected to the gate electrode of the vertical transistor SV006.

A bit line BL01 of the memory array ARRAY1 is connected to the data line DATA1 via a vertical transistor SV001, and a bit line BLml is connected to the data line DATA1 via a vertical transistor SV000, respectively. A controlling signal YSW01 is connected to the gate electrode of the vertical transistor SV001, and a controlling signal YSWm1 is connected to the gate electrode of the vertical transistor SV000.

A bit line BL0r of the memory array ARRAYr is connected to the data line DATAr via a vertical transistor SV005, and a bit line Blmr is connected to the data line DATAr via the vertical transistor SV006, respectively. A controlling signal YSW0r is connected to the gate electrode of the vertical transistor SV005, and a controlling signal YSWmr is connected to the gate electrode of the vertical transistor SV006. A sense amplifier circuit SA and write amplifier circuits WA are connected to the data lines (DATA1 and DATAr).

Operation Method

Figure 20:
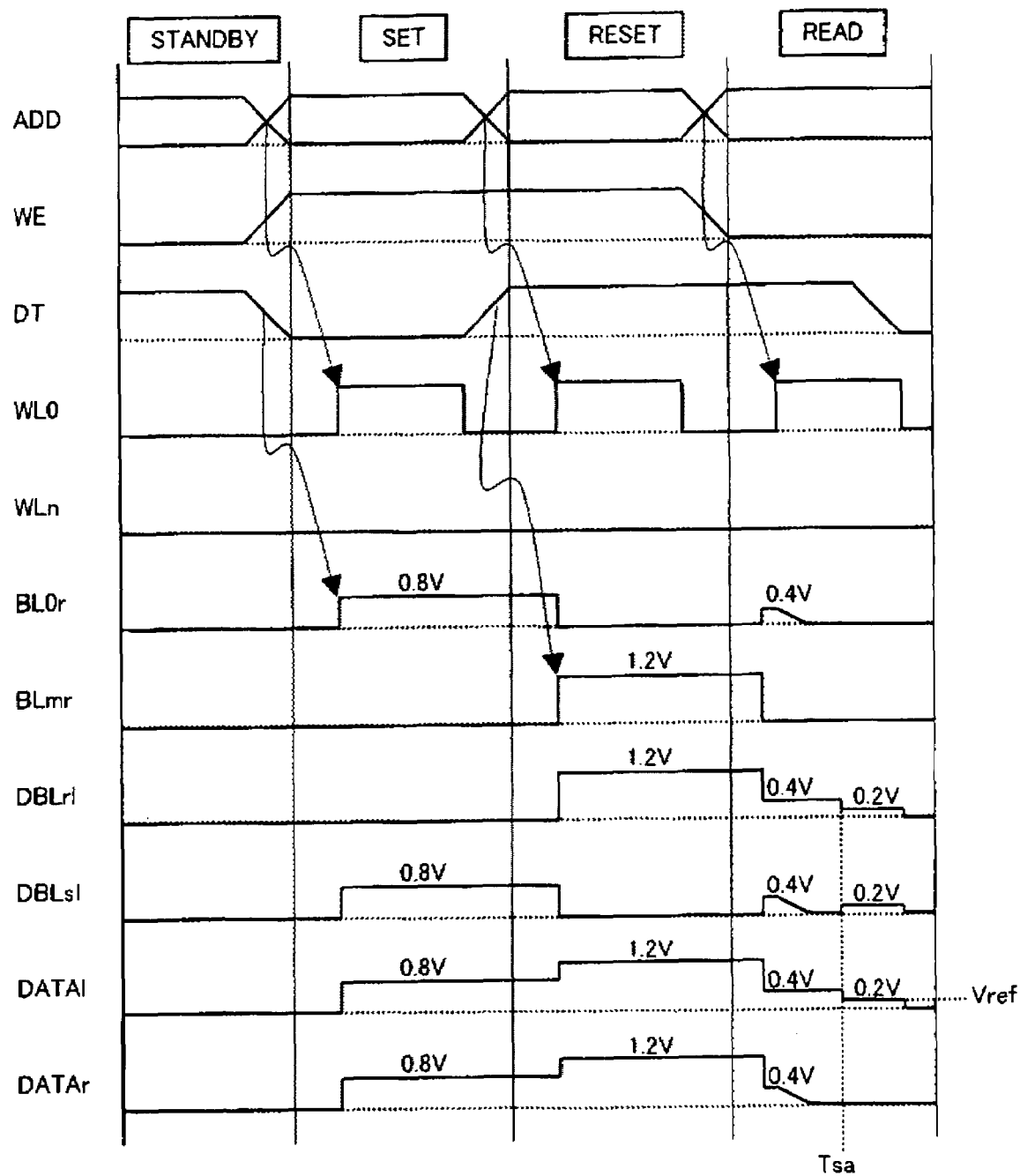
FIG. 20 is an operation wave form diagram of the memory block shown in FIG. 19.

Next, detailed operations will be explained by use of FIG. 20. The basic operations are almost the same as the way described in Embodiment 1, therefore the different part will be mainly explained. The power supply voltage is, for example, 1.2 V. At first, a standby state STANDBY is maintained, and when the address ADD is switched and the writing controlling signal WE becomes 'H', writing operation is started. A case in which '0' is to be written in to a memory cell MC00 (unillustrated) which is disposed on the intersecting point of the bit line BL0r and the word line WL0, and '1' is to be written in to a memory cell MC0m (unillustrated) which is disposed at the intersecting point of the bit line BLmr and the word line WL0, is explained. The writing-in operations are required at the same time. However, a SET operation in which '0' is to be written in is carried out first, and then a RESET operation in which '1' is to be written in is carried out. First, the bit line BL0r and the word line WL0 are selected in the method described in Embodiment 1. At the same time, the dummy bit line DBLs1 is driven. In the SET operation of the present embodiment, 0.8 V is applied to the bit line BL0r and the dummy bit line DBLs1, and this state is maintained for 100 nanoseconds to several microseconds. As a result, each of the memory elements of the memory cell MC00 and the dummy cell MDs0 is crystallized and attains low resistance.

Then, the word line WL0 slowly transits from 'H' to 'L' and the SET operation is completed. Next, a RESFT operation in which '1' is to be written in to the memory cell MC0m will be explained. The bit line BLmr and the word line WL0 are selected, and at the same time, the dummy bit line DBLR1 is also driven. In the RESFT operation, for example, the electric potential of the bit line Blmr and the dummy bit line DBLr1 is maintained at 1.2 V, and this state is maintained for 5 nanoseconds to several tens of nanoseconds. As a result, the element attains melted state. Then, the word line KLn is caused to transit from 'H' to 'L' so as to rapidly reduce the voltage applied to the element, and rapid cooling is carried out. By virtue of the rapid cooling, the memory elements of the memory cell MC0m and the dummy cell MDr0 undergo transition to the amorphous state and attain high resistance.

Next, a READ operation which is a reading-out operation is explained in a case in which the above described written data '0' is read out from the memory cell MC00. When a READ operation is started, the bit line BL0r and the data line DATAr are precharged, for example, to 0.4 V by a Y-address decoder block YDECB and a read/write circuit RWC. Also, at the same tire, the dummy bit lines (DBLr1 and DBTs1) and the data line DATA1 are precharged to, for example, 0.4 V. Then, the word line WL0 is activated from 'L' to 'H', and current is caused to flow from the bit line BL0r to ground potential. Since low resistance value is written in the memory cell MC00, the bit line BL0 and the data line DATAr are discharged and attain 0 V. If a high resistance value has been written in the memory cell MC00, the bit line BL0 undergo little change and 0.4 V is maintained. Meanwhile, current is also caused to flow from the dummy bit lines (DBLr1 and DBs1) to ground potential.

Since a low resistance value is written in the dummy cell MDs0, the dummy bit line DBLs1 is discharged and attain 0 V. Since a high resistance value is written in the dummy cell MDR0, the dummy bit line DBLr1 undergo little change and 0.4 V is maintained. After the tire Tsa when the electric potential of the bit line and the dummy bit line have been changed enough, for example, after 10 nanoseconds, the vertical transistors (SV003 and SV002) are turned on, and the data line DATA1 is driven. The electric potential of the data line DATA1 becomes about 0.2 V which is the middle electric potential of the dummy bit line DBLr1 and the dummy bit line DBLs1. In the read/write circuit RWC, the difference in electric potentials of the data line DATAr and the data line DATA1 is amplified and the data is output to D, and reading-out is completed.

Since a low resistance value is written in the memory cell MC00, the data line DATAr is discharged and attains 0 V. Meanwhile, since the data line DATA1 has a higher potential than that, the difference in electric potentials is amplified and '0' is read out. If a high resistance value has been written in to the memory cell MC00, the data line DATAr is maintained at about 0.4 V. Since the electric potential of the data line DATA1 is lower than that, the difference in electric potentials is amplified and '1' is read out.

Also, the structure may be configured such that one memory cell is comprised of two vertical transistors and two memory elements, and the two memory elements always have input data opposite to each other. By amplifying the difference in electric potentials of two bit lines which are driven by the two memory elements, the dummy circuits may be omitted.

The present method is also effective in a memory which is comprised of only memories having a structure in which memory blocks are not laminated and CMOS.

What is claimed is:

1. A semiconductor device, comprising:
   a plurality of word lines;
   a plurality of bit lines intersecting with the plurality of word lines;
   a plurality of memory cells disposed on the intersecting points of the plurality of word lines and the plurality of bit lines;
   a plurality of dummy bit lines intersecting with the plurality of word lines;
   a plurality of dummy memory cells disposed on the intersecting points of the plurality of word lines and the plurality of dummy bit lines;
   a plurality of circuits that select columns;
   a plurality of circuits that select word lines;
   a sense amplifier circuit;
   a plurality of write amplifier circuits; and
   a memory array including the plurality of memory cells and the plurality of dummy memory cells, the memory array is separated into at least two sub-arrays, each of the memory arrays having two columns of the dummy memory cells,
   wherein a high resistance value is written in one of the two columns of the dummy memory cells, and a low resistance value is written in the other one of the two columns of the dummy memory cells.

2. The semiconductor device according to claim 1, wherein, in one of the sub-arrays which is not accessed during reading-out, the data of the two columns of dummy memory cells are read out respectively by the dummy bit lines, and the dummy bit lines are electrically connected upon reading-out.

* * * * *